United States Patent
Antonov et al.

(10) Patent No.: US 8,940,388 B2
(45) Date of Patent: Jan. 27, 2015

(54) INSULATIVE ELEMENTS

(75) Inventors: Vassil Antonov, Boise, ID (US);
Jennifer K. Sigman, Boise, ID (US);
Vishwanath Bhat, Boise, ID (US);
Matthew N. Rocklein, Boise, ID (US);
Bhaskar Srinivasan, Boise, ID (US);
Chris Carlson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 789 days.

(21) Appl. No.: 13/038,605

(22) Filed: Mar. 2, 2011

(65) Prior Publication Data

US 2012/0225268 A1 Sep. 6, 2012

(51) Int. Cl.
| | | |
|---|---|---|
| *B32B 7/02* | (2006.01) | |
| *H01G 4/33* | (2006.01) | |
| *H01G 4/30* | (2006.01) | |
| *H01G 4/12* | (2006.01) | |

(52) U.S. Cl.
CPC .................. *H01G 4/33* (2013.01); *H01G 4/306* (2013.01); *H01G 4/1209* (2013.01); *H01G 4/1272* (2013.01); *H01G 4/1218* (2013.01); *H01G 4/1236* (2013.01); *H01G 4/1254* (2013.01)
USPC .......... 428/213; 428/702; 428/220; 438/240; 438/381; 438/246; 438/434; 257/532; 257/635; 257/303

(58) Field of Classification Search
None
See application file for complete search history.

(56) References Cited

U.S. PATENT DOCUMENTS

| | | | |
|---|---|---|---|
| 4,569,701 A | 2/1986 | Oh | |
| 4,604,150 A | 8/1986 | Lin | |
| 5,396,094 A * | 3/1995 | Matsuo | 257/310 |
| 5,463,978 A | 11/1995 | Larkin et al. | |
| 6,083,805 A | 7/2000 | Ouellet et al. | |
| 6,268,620 B1 | 7/2001 | Ouellet et al. | |
| 6,358,810 B1 | 3/2002 | Dornfest et al. | |
| 6,559,014 B1 * | 5/2003 | Jeon | 438/287 |
| 7,101,754 B2 | 9/2006 | My Ali et al. | |
| 7,635,623 B2 | 12/2009 | Bhat et al. | |
| 7,696,552 B2 | 4/2010 | Youn et al. | |
| 7,820,506 B2 | 10/2010 | Rocklein et al. | |
| 2004/0087081 A1 | 5/2004 | Aitchison et al. | |
| 2004/0092038 A1 | 5/2004 | Nakanishi | |

(Continued)

FOREIGN PATENT DOCUMENTS

JP          2000004012 A      1/2000

OTHER PUBLICATIONS

Prasai et al., "Properties of amorphous and crystalline titanium dioxide," Journal of Materials Science, Apr. 3, 2012.*

(Continued)

*Primary Examiner* — David Sample
*Assistant Examiner* — Nicole T Gugliotta
(74) *Attorney, Agent, or Firm* — TraskBritt

(57) ABSTRACT

Methods of forming an insulative element are described, including forming a first metal oxide material having a first dielectric constant, forming a second metal oxide material having a second dielectric constant different from the first, and heating at least portions of the structure to crystallize at least a portion of at least one of the first dielectric material and the second dielectric material. Methods of forming a capacitor are described, including forming a first electrode, forming a dielectric material with a first oxide and a second oxide over the first electrode, and forming a second electrode over the dielectric material. Structures including dielectric materials are also described.

20 Claims, 7 Drawing Sheets

(56) References Cited

U.S. PATENT DOCUMENTS

| | | | |
|---|---|---|---|
| 2007/0252244 A1 | 11/2007 | Srividya et al. | |
| 2008/0118731 A1 | 5/2008 | Srinivasan et al. | |
| 2009/0102019 A1 | 4/2009 | Haight et al. | |
| 2009/0257170 A1 | 10/2009 | Bhat et al. | |
| 2010/0316793 A1* | 12/2010 | Krishnan et al. | 427/79 |
| 2011/0000875 A1* | 1/2011 | Antonov et al. | 216/13 |

OTHER PUBLICATIONS

Vanderbilt et al., "Structural and dielectric properties of crystalline and amorphous ZrO2," Thin Solid Films 486 (2005) 125-128.*

Karditsas et al., "Thermal and Structural Properties of Fusion related Materials," Aluminum Oxide (Al2O3), http://www-ferp.ucsd.edu/LIB/PROPS/PANO/al2o3.html. University of California San Diego, website created Jul. 15, 2007.*

* cited by examiner

US 8,940,388 B2

INSULATIVE ELEMENTS

TECHNICAL FIELD

Embodiments of the present disclosure relate to forming an insulative element having a high dielectric constant (k) and a low leakage current. Specific embodiments of the present disclosure relate to forming the insulative element having a high k and low leakage current from a metal oxide material doped with another, different metal oxide material.

BACKGROUND

Capacitors are the basic energy storage devices in random access memory devices, such as dynamic random access memory ("DRAM") devices. Capacitors include two conductors, such as parallel metal or polysilicon plates, which act as electrodes. The electrodes are insulated from each other by a dielectric material. With the continual shrinkage of microelectronic devices, such as capacitors, the materials traditionally used in integrated circuit technology are approaching their performance limits. Silicon dioxide ("$SiO_2$") has frequently been used as the dielectric material in capacitors. However, with smaller and smaller capacitor area, $SiO_2$ cannot be thinned to provide sufficient capacitance while maintaining low leakage. This deficiency has lead to a search for improved dielectric materials. High quality, thin dielectric materials possessing higher dielectric constants (k) than $SiO_2$ are of interest to the semiconductor industry. Examples of materials having dielectric constants (k) greater than $SiO_2$ include hafnium oxide ("$HfO_2$"), zirconium oxide ("$ZrO_2$"), and strontium titanate ("$SrTiO_3$"). In general, dielectric materials with a higher dielectric constant also exhibit higher leakage currents. Dielectric materials are typically formed by chemical vapor deposition ("CVD") or atomic layer deposition ("ALD"). However, CVD is unable to provide good step coverage and film stoichiometry in high aspect ratio containers. Therefore, CVD is not useful to fill high aspect ratio containers. While ALD provides good step coverage, current CVD and ALD techniques each produce high-k dielectric materials that have high leakage.

To produce a capacitor, a bottom electrode is formed on a semiconductor substrate and a dielectric material is deposited over the bottom electrode. The bottom electrode and the dielectric material are annealed, and a top electrode is formed over the dielectric material. The dielectric material is typically annealed before the top electrode is formed.

U.S. Pat. No. 7,101,754 discloses forming mixed dielectric films, composed of a high-k dielectric to produce a certain level of capacitance and a relatively lower-k dielectric to control leakage current, on a conductor material. The dielectric film having a composition of $SiO_2$ and $TiO_2$ made by a sol-gel process is applied onto a substrate using a spin-on technique. The discontinuous layer is annealed in the presence of a reactive species so that exposed portions of the conductor material are converted to an insulating material. However, forming the mixed dielectric films is difficult due to the, oftentimes, conflicting deposition requirements of the high-k dielectric and the relatively lower-k dielectric.

DETAILED DESCRIPTION

Figure 1:
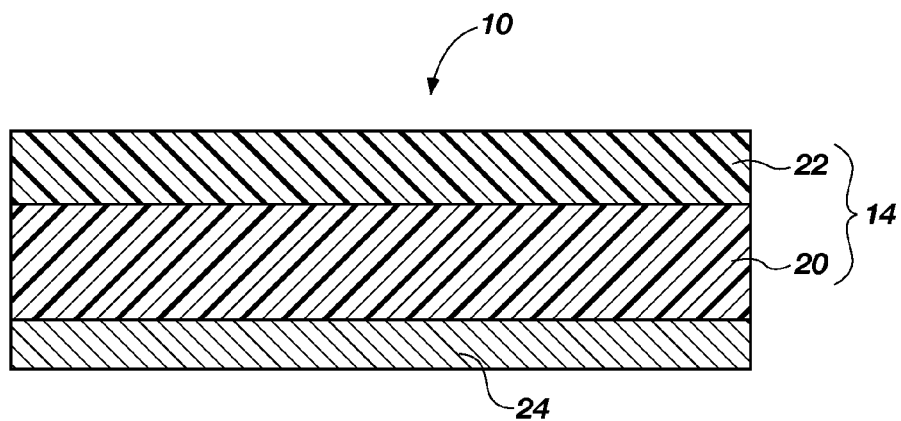
FIG. 1 shows a partial cross-sectional view of an embodiment of an insulative element according to the present disclosure.

The following description provides specific details, such as material types, material thicknesses, and processing conditions in order to provide a thorough description of embodiments of the present invention. However, a person of ordinary skill in the art will understand that the embodiments of the present invention may be practiced without employing these specific details. Indeed, the embodiments of the present invention may be practiced in conjunction with conventional fabrication techniques employed in the industry.

As used herein, the term "amorphous" means and includes without a real or apparent crystalline form, such as non-crystalline or at least substantially non-crystalline.

As used herein, the term "crystalline" means and includes a monocrystalline or polycrystalline chemical structure or phase. A crystalline phase may include one or more molecules of another material.

As used herein, terms such as "first" and "second" are used to merely differentiate between structures, methods, materials, or other components, and do not necessarily refer to any particular sequence.

As used herein, the term "forming" means and includes any method of creating, building, or depositing a material. For example, forming may be accomplished by atomic layer deposition (ALD), chemical vapor deposition (CVD), sputtering, spin-coating, diffusing, depositing, growing, or any other forming technique known in the art of semiconductor fabrication.

As used herein, the term "substantially" means and includes mostly, essentially, fully, or entirely. By way of example, the phrase "a substantially crystalline material" may refer to a material with a portion in a crystalline state, the portion in the range of from about 90% by volume up to and including about 100% by volume of the material, and a remaining portion (i.e., about 10% to about 0% by volume, respectively) in an amorphous state.

As used herein, the term "substrate" refers to any supporting base material, structure, or construction. By way of example and not limitation, a substrate may be a semiconductor substrate, a base semiconductor layer or structure on a supporting structure, a metal or polysilicon electrode, or a semiconductor substrate having one or more layers, structures, or regions formed thereon. In some embodiments, a semiconductor substrate may have at least a portion thereof doped so as to be conductive, such as an n-doped or p-doped silicon substrate.

As used herein, the term "structure" refers to a layer or film, or to a nonplanar mass, such as a three-dimensional mass, having a substantially nonplanar configuration. The term "structure" also may refer to a mass formed of more than one layer, film, non-planar mass, or combination thereof.

Some embodiments of insulative elements including dielectric materials having a high dielectric constant (k) and a low leakage current are shown in FIGS. 1 through 4 and are described as follows. Similar structures or components in the various drawings may retain the same or similar numbering for the convenience of the reader; however, the similarity in numbering does not mean that the structures or components are necessarily identical in size, composition, configuration, or any other property. The insulative elements include a first dielectric material and a second dielectric material. During fabrication of the insulative element, the second dielectric material may be formed as a capping material over the first dielectric material and may function as a dopant source for the first dielectric material. Upon exposure to heat, the second dielectric material may form an alloy phase with the first dielectric material. In combination, the first dielectric material and the second dielectric material may form a dielectric material of the insulative element.

Figure 2:
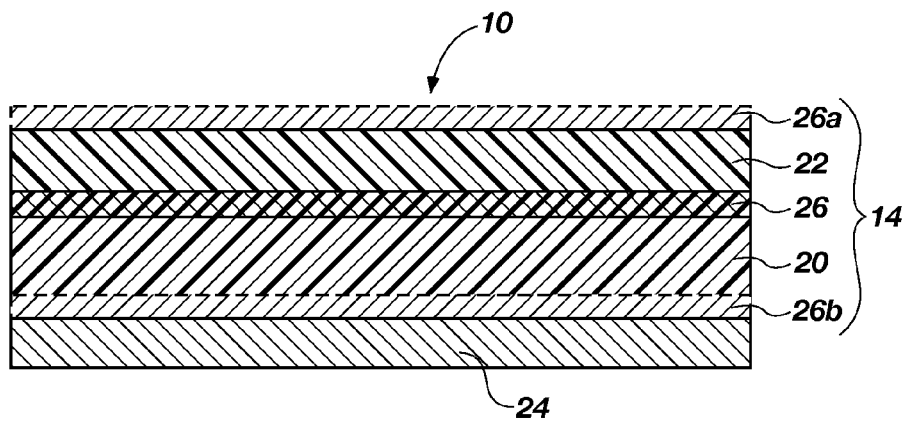
FIG. 2 shows a partial cross-sectional view of a second embodiment of an insulative element according to the present disclosure.
Figure 3:
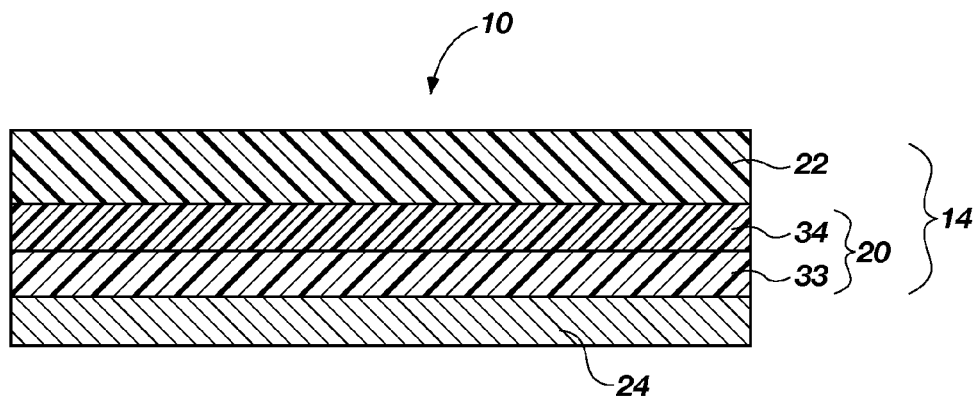
FIG. 3 shows a partial cross-sectional view of a third embodiment of an insulative element according to the present disclosure.

In some embodiments, an insulative element 10, as shown in any of FIGS. 1 through 3, may be used as a component of a semiconductor device. By way of example, the insulative element 10 may be useful as a dielectric material in a capacitor, such as in a planar cell, trench cell, (e.g., double sidewall trench capacitor), or stacked cell (e.g., crown, V-cell, delta cell, multi-fingered, or cylindrical container stacked capacitor). The insulative element 10 may also be useful as a gate dielectric in a transistor, or as an insulating material between conductive components or portions thereof that are to be isolated electrically. While the intended uses of the insulative elements 10 are described herein, any application where high-k dielectric materials may be desirable is contemplated by the present disclosure. The insulative element 10 may be used in a metal-insulator-metal (MIM) capacitor or a metal-insulator-semiconductor (MIS) capacitor or gate stack. The insulative element 10 may provide a high dielectric constant (k) and a low leakage current to a semiconductor device that includes the insulative element 10.

As shown in FIG. 1, some embodiments of the present disclosure include an insulative element 10 having a high dielectric constant (k) with low leakage current. The insulative element 10 may include a first dielectric material 20 and a second dielectric material 22 over a substrate 24. In some embodiments, the substrate 24 may be or include a conductive material, such as at least one of polysilicon and a metal including, but not limited to, platinum, aluminum, iridium, rhodium, ruthenium, titanium, tantalum, tungsten, alloys thereof, and combinations thereof. If the insulative element 10 is to be used in a MIM capacitor, the substrate 24 may be a metal electrode. If the insulative element 10 is to be used in a MIS capacitor or gate stack, the substrate 24 may be silicon.

The first dielectric material 20 and the second dielectric material 22 may each include at least one metal oxide material, with the first dielectric material 20 and the second dielectric material 22 including different metal oxide materials that have different dielectric constants (k). To provide the different dielectric constants (k), the metal oxide materials of the first dielectric material 20 and the second dielectric material 22 may differ in the elements present therein or in the stoichiometry of the elements present therein. By way of example and not limitation, the metal oxide material of the first dielectric material 20 may include one or more of a hafnium oxide ($Hf_yO_x$, such as $HfO_2$), a zirconium oxide ($Zr_yO_x$, such as $ZrO_2$), an aluminum oxide ($Al_yO_x$, such as $Al_2O_3$), a strontium oxide ($Sr_yO_x$, such as SrO), a titanium oxide ($Ti_yO_x$, such as $TiO_2$), a niobium oxide ($Nb_yO_x$, such as $Nb_2O_5$), a tantalum oxide ($Ta_yO_x$, such as $Ta_2O_5$), and a rare earth oxide, wherein each of x and y is an integer greater than or equal to 1. As used herein, the phrase "rare earth oxide" refers to an oxide of a rare earth element, including the elements scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). The first dielectric material 20 may also include one or more of a silicon oxide ($Si_yO_x$, such as $SiO_2$), a germanium oxide ($Ge_yO_x$, such as $GeO_2$), and an oxynitride (such as $SiO_xN_y$ or $HfO_xN_y$).

The second dielectric material 22 may include a metal oxide or combinations of metal oxides different from the first dielectric material 20. The second dielectric material 22 may include one or more of the metal oxides described above for the first dielectric material 20, such as at least one of $HfO_2$, $ZrO_2$, $Al_2O_3$, SrO, $TiO_2$, $Nb_2O_5$, $Ta_2O_5$, and a rare earth oxide. The second dielectric material 22 may also include one or more of $SiO_2$, $GeO_2$, and an oxynitride. The composition of the second dielectric material 22 may differ from the composition of the first dielectric material 20 in that the second dielectric material 22 may include different elements than the first dielectric material 20 or, if the same elements are present, a different stoichiometry of the respective elements. In some embodiments, the second dielectric material 22 may include one or more of the same metal oxides as the first dielectric material 20, in addition to another metal oxide material. For example, where the first dielectric material 20 includes primarily $HfO_2$, the second dielectric material 22 may include $HfO_2$ in combination with another metal oxide, such as $TiO_2$. Therefore, the overall composition of the second dielectric material 22 may differ from the overall composition of the first dielectric material 20, although some similarity in composition may be present.

In some embodiments, the first dielectric material 20 includes one or more of $HfO_2$ and $ZrO_2$ and, optionally, one or more of $Al_2O_3$ and $SiO_2$, and the second dielectric material 22 includes one or more of SrO, $TiO_2$, $Nb_2O_5$, $Ta_2O_5$, and the rare earth oxide. For example, the first dielectric material 20 may include at least one of $HfO_2$ and $ZrO_2$ and at least one of $SiO_2$ and $Al_2O_3$, the latter of which, if present, may account for a relatively small proportion of the first dielectric material 20. The second dielectric material 22 may, optionally, also include one or more of $SiO_2$, $Al_2O_3$, $ZrO_2$, and another material, in addition to the one or more of SrO, $TiO_2$, $Nb_2O_5$, $Ta_2O_5$, and the rare earth oxide. The first dielectric material 20 may also include at least a portion (such as the portion closest to the second dielectric material 22) within which molecules of the second dielectric material 22 are dispersed. In other words, the portions of the first dielectric material 20 may be "doped" with metal oxide molecules of the second dielectric material 22. As used herein, the term "dispersed" means and includes located within, and may refer to varying concentrations across a region (i.e., heterogeneous) or may refer to a substantially constant concentration across a region (i.e., homogeneous). Molecules dispersed in a structure or material may refer to molecules located at various positions in the structure or material. For example, dispersed molecules may include molecules of the second dielectric material 22 incorporated into the crystalline phase of the first dielectric material 20, located between the grain boundaries of the crystalline phase of the first dielectric material 20, located in an amorphous portion of the first dielectric material 20, or combinations thereof.

The metal oxide material of the second dielectric material 22 may be selected to have a dielectric constant (k) higher than the dielectric constant (k) of the metal oxide material of the first dielectric material 20. For example, if the first dielectric material 20 includes primarily $HfO_2$, which has a dielectric constant (k) of about 25, the second dielectric material 22 may include primarily $Nb_2O_5$, which has a dielectric constant (k) of about 41. However, the selection of metal oxide materials of the first and second dielectric materials 20, 22 may be altered such that the metal oxide material of the second dielectric material 22 has a dielectric constant (k) lower than the dielectric constant (k) of the metal oxide material of the first dielectric material 20. The difference in dielectric constant (k) between the first and second dielectric materials 20, 22 may be less than about 5.

In some embodiments, a material forming a majority of a region or material may be referred to as a matrix, and a material forming a smaller portion of the region may be referred to as a dopant. The matrix may have the dopant(s) dispersed therein. By way of example, the first dielectric material may function as the matrix while the metal oxide of the second dielectric material may function as the dopant(s).

In some embodiments, there may be no clear interface or boundary between the first dielectric material 20 and the second dielectric material 22. For example, some regions of the first dielectric material 20 may exhibit a relatively higher concentration of metal oxide molecules from the second dielectric material 22 and other regions of the first dielectric material 20 may exhibit a relatively lower concentration of metal oxide molecules from the second dielectric material 22. However, for convenience and clarity, the first and second dielectric materials 20, 22 are illustrated herein as having a distinct interface between adjacent materials.

The first dielectric material 20 may be formed at a greater thickness than the second dielectric material 22. For example, the first dielectric material 20 may have a thickness of between about 30 Angstroms (Å) and about 80 Å, and the second dielectric material 22 may have a thickness of between about 5 Å and about 30 Å. The second dielectric material 22 may be sufficiently thin such that its contribution to the total thickness of the dielectric material 14 (the first dielectric material 20 and the second dielectric material 22, see FIG. 4) is minimal compared to its contribution to the dielectric constant of the first dielectric material 20 and the second dielectric material 22. Depending on the intended use of the insulative element 10, one or both of the first and second dielectric materials 20, 22 may be thicker or thinner than the ranges recited.

The first dielectric material 20 of the insulative element 10 may be substantially crystalline, although some portions of the first dielectric material 20 may be amorphous. In some embodiments, the second dielectric material 22 may be substantially crystalline. However, in other embodiments, the second dielectric material may be substantially amorphous. In some embodiments, at least a portion of the metal oxides of the second dielectric material 22 may be distributed in the first dielectric material 20. In other words, at least some of the metal oxide molecules of the second dielectric material 22 may be incorporated into or distributed within or between the lattice or crystalline phase of the first dielectric material 20. As described in more detail below, molecules of the metal oxide of the second dielectric material 22 may diffuse into the first dielectric material 20, doping the first dielectric material 20 with the metal oxide of the second dielectric material 22.

A crystalline dielectric material generally has a higher dielectric constant (k) compared to the same dielectric material in an amorphous phase or state. Thus, the dielectric constant (k) of the insulative element 10 may be tailored by crystallizing none, some, portions of, or substantially all of the first and second dielectric materials 20, 22, for example.

The crystalline phase of one or both of the first and second dielectric materials 20, 22 may be achieved by annealing one or both of the metal oxide materials of the first and second dielectric materials 20, 22. Additionally, the dispersion of molecules of the second dielectric material 22 within the first dielectric material 20 (also referred to as "doping" of the first dielectric material 20) may be accomplished by annealing the metal oxide material of the first and second dielectric materials 20, 22. As used herein, "annealing" refers to subjecting to elevated temperatures, or heating, for a period of time. A more detailed description of annealing and crystallizing the metal oxide materials is provided below. Annealing one or both of the metal oxide materials of the first and second dielectric materials 20, 22 may provide the insulative element 10 having the higher k compared to a so-called "mixed dielectric" in which a material including a mixture of two dielectric materials is formed and then annealed.

Referring now to FIG. 2, in some embodiments, one or more additional materials may be present as a part of the insulative element 10. For example, an additional dielectric material 26 may be located between the first dielectric material 20 and the second dielectric material 22. The additional dielectric material 26 may function as a barrier material, preventing or reducing the diffusion and dispersion of molecules of the second dielectric material 22 across the additional dielectric material 26.

In some embodiments, the insulative element 10 may include the additional dielectric material 26 located over the second dielectric material 22 (i.e., on the side of the second dielectric material 22 opposite the first dielectric material 20, shown by dashed lines in FIG. 2 as additional dielectric material 26a) or located between the substrate 24 and the first dielectric material 20 (shown by dashed lines in FIG. 2 as additional dielectric material 26b), rather than or in addition to between the first and second dielectric materials 20, 22. The additional dielectric material 26 may modulate diffusion of the second dielectric material 22 into the first dielectric material 20.

The additional dielectric material 26 may include one or more of $HfO_2$, $SiO_2$, $ZrO_2$, $Al_2O_3$, $GeO_2$, and a rare earth oxide. The additional dielectric material 26 may have a different composition than the first dielectric material 20, the second dielectric material 22, or both the first and second dielectric materials 20, 22. In some embodiments, the additional dielectric material 26 may include one or more similar metal oxides to the metal oxide(s) of the first, second, or first and second dielectric materials 20, 22. By way of example and not limitation, in an embodiment where the first dielectric material 20 includes primarily $HfO_2$ and the second dielectric material 22 includes primarily $TiO_2$, the additional dielectric material 26 may include primarily $SiO_2$ or $Al_2O_3$. The overall composition of the additional dielectric material 26 may differ from the overall composition of one or both of the first and second dielectric materials 20, 22, although some similarity in composition may occur.

The additional dielectric material 26 may, in some embodiments, have a thickness that is less than a thickness of the first dielectric material 20. In some embodiments, the additional dielectric material 26 may have a thickness that is less than both a thickness of the first dielectric material 20 and a thickness of the second dielectric material 22. By way of example and not limitation, the dielectric material 26 may have a thickness in the range of from about one monolayer to about 5 Å.

In some embodiments, the thickness of the additional dielectric material 26 may not be clearly defined due to diffusion of the additional dielectric material 26 into one or both of the first dielectric material 20 and the second dielectric material 22. In some embodiments, the first dielectric material 20 may include at least portions (such as those closest to the second dielectric material 22) wherein molecules of the metal oxides of the second dielectric material 22 are dispersed. In other words, the portions of the first dielectric material 20 may be "doped" with molecules of the second dielectric material 22.

Referring now to FIG. 3, in some embodiments, the first dielectric material 20 may have a first region 33 being at least substantially free of molecules of the metal oxide material of the second dielectric material 22, and a second region 34 including molecules of the second dielectric material 22 dispersed therein. A majority by volume of the first region 33 and a majority by volume of the second region 34 of the first dielectric material 20 may include the same dielectric material, although the second region 34 may additionally include a higher concentration of molecules of the second dielectric material 22 dispersed therein than the first region 33. In some embodiments, the first region 33 and the second region 34 may each be substantially crystalline. In some embodiments, the first region 33, the second region 34, and the second dielectric material 22 may each be substantially crystalline.

While embodiments of the insulative element 10 have been described and illustrated with the first and second dielectric materials 20, 22 having specific compositions and shown to be in specific configurations, it is to be understood that these descriptions may be altered. For example, a material with a composition similar or identical to the second dielectric material 22 may be formed on a substrate 24 first, and a material with a composition similar or identical to the first dielectric material 20 may be formed over the second dielectric material 22. In some embodiments, overall properties (e.g., dielectric constant, capacitance, leakage current) of the insulative element 10 may be changed or tailored by altering the configuration of the first dielectric material 20 and the second dielectric material 22.

Figure 4:
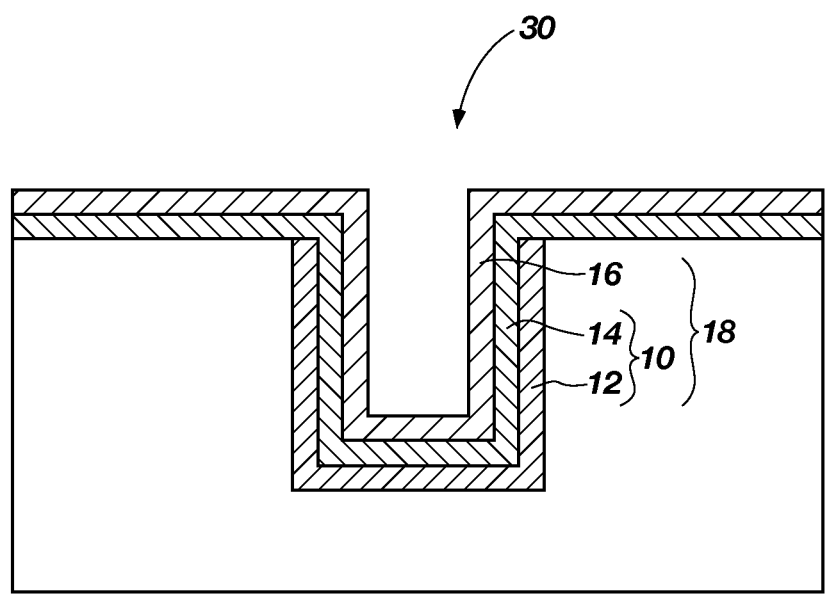
FIG. 4 shows a partial cross-sectional view of an embodiment of a capacitor including an insulative element as in FIG. 1, FIG. 2, or FIG. 3.

Referring now to FIG. 4, some embodiments of the invention include a semiconductor device structure 30 including a first electrode 12, a second electrode 16, and dielectric material 14, at least portions of which are located between the first electrode 12 and the second electrode 16. The first electrode 12, dielectric material 14, and second electrode 16 may be collectively referred to as a capacitor 18.

The first electrode 12 may be a conductive element, which may include, for example, one or more of polysilicon and a metal, including, but not limited to, platinum, aluminum, iridium, rhodium, ruthenium, titanium, tantalum, tungsten, alloys thereof, and combinations thereof. The dielectric material 14 may be formed over the first electrode 12. The second electrode 16 may also be a conductive element, which may likewise include, for example, one or more of polysilicon and a metal, including, but not limited to, platinum, aluminum, iridium, rhodium, ruthenium, titanium, tantalum, tungsten, alloys thereof, and combinations thereof.

The dielectric material 14 may include one of the insulative elements 10 illustrated and described in reference to FIGS. 1 through 3 above and, therefore, may include first and second dielectric materials 20 and 22, which may, by way of example, have a composition as described with reference to any of FIGS. 1 through 3 above or variations and equivalents thereof. For example, the dielectric material 14 may include the first dielectric material 20 and the second dielectric material 22. The first dielectric material 20 may be at least substantially crystallized and have a first dielectric constant. The first dielectric material 20 may be at least partially doped with the second dielectric 22 material having a second dielectric constant.

Some embodiments of methods of forming insulative elements 10 or a semiconductor device structure 30, such as those shown in FIGS. 1 through 4, are shown in FIGS. 5A through 7F and are described as follows. First and second oxide materials 29, 32 may be formed over a substrate 24 and the first and second oxide materials 29, 32 annealed to modulate the interaction between the matrix of the first oxide material 29 and the dopant of the second oxide material 32. The first and second dielectric materials 20, 22 may be formed in this manner. The timing of the anneal in the process flow may determine whether dopant interdiffusion is promoted or inhibited. The timing of the anneal in the process flow may provide the semiconductor device structure 30 having increased k through enhanced diffusion of the dopant or decreased k by hindering the diffusion of the dopant.

Figure 5A:
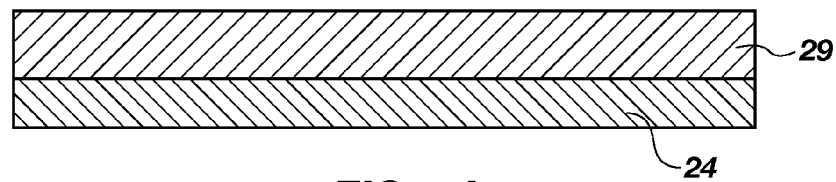
FIGS. 5A through 5D illustrate an embodiment of a process for forming an insulative element according to the present disclosure, such as the insulative element of FIG. 1.
Figure 5B:
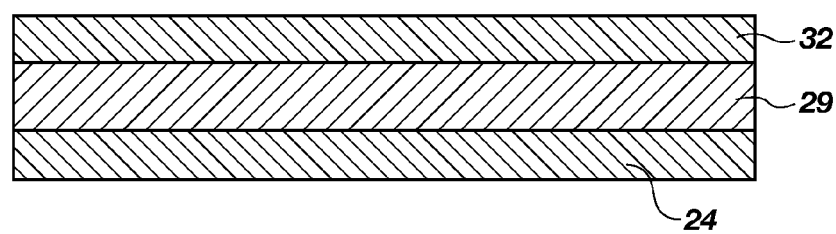

One embodiment of a method showing the formation of an insulative element 10 (as shown in FIG. 1, for example) or a capacitor is shown in FIGS. 5A through 5D. A first metal oxide material 29 may be formed on a substrate 24, as shown in FIG. 5A. By way of example and not limitation, the substrate 24 may be or include a capacitor electrode, a portion of a transistor, a semiconductive film, a doped portion of a semiconductor material, any other structure whereon a metal oxide material may be formed, or any combination thereof. The first metal oxide material 29 may be substantially amorphous at formation. In some embodiments, certain formation techniques, such as CVD, may produce sufficient heat to cause the crystallization of one or more portions of the first metal oxide material 29 upon formation. However, at least a portion of the first metal oxide material 29 may remain amorphous during the formation thereof.

By way of example and not limitation, the first metal oxide material 29 may be formed to a thickness sufficiently thin to enable small feature sizes of an integrated circuit to be formed and to enable high capacitance (which is inversely related to the distance from one electrode to another, i.e., the thickness of the dielectric material 14, see FIG. 4). At the same time, the first metal oxide material 29 may be formed to be of sufficient thickness to reduce defects and undesirable properties, such as leakage current, in the semiconductor device structure 30. By way of example and not limitation, the first metal oxide material 29, as formed, may have a thickness in the range of from about 30 Å to about 80 Å.

The first metal oxide material 29 may be formed from at least one or more of $HfO_2$, $ZrO_2$, $Al_2O_3$, SrO, $TiO_2$, $Nb_2O_5$, $Ta_2O_5$, and a rare earth oxide. The first metal oxide material 29 may also be formed to include one or more of $SiO_2$, $GeO_2$, and an oxynitride. By way of example and not limitation, the first metal oxide material 29 may be formed from one or more of $HfO_2$ and $ZrO_2$ and, optionally, one or more of $Al_2O_3$, and $SiO_2$.

A second metal oxide material 32 may be formed over the first metal oxide material 29 or portions thereof. The second metal oxide material 32 may be formed from a material(s) selected to have a different dielectric constant (k) than the first metal oxide material 29. For example, the second metal oxide material 32 may be a material(s) selected to have a higher dielectric constant (k) than the first metal oxide material 29. In some embodiments, at least a substantial portion of the second metal oxide material 32 may be a material with a higher dielectric constant than the first metal oxide material 29. By way of example, the second metal oxide material 32 may be formed from one or more of SrO, $TiO_2$, $Nb_2O_5$, $Ta_2O_5$, and a rare earth oxide when the first metal oxide material 29 is formed from one or more of $HfO_2$, $ZrO_2$, $SiO_2$, and $Al_2O_3$. Optionally, the second metal oxide material 32 may also include a material(s) having a relatively lower dielectric constant (k), such as, for example, one or more of $SiO_2$, $Al_2O_3$, $ZrO_2$, and $HfO_2$.

The second metal oxide material 32 may be formed to be at least substantially amorphous at formation. In some embodiments, certain formation techniques, such as CVD, may produce sufficient heat to cause the crystallization of some of the second metal oxide material 32 at formation. However, at least a portion of the second dielectric material 22 may remain amorphous during the formation thereof.

The second metal oxide material 32 may be formed to be sufficiently thin to limit its contribution to the total thickness of the dielectric material 14. However, the second metal oxide material 32 may have sufficient thickness to provide a doping effect on the first metal oxide material 29. The doping may occur when molecules of the second metal oxide material 32 diffuse or migrate into the first metal oxide material 29. In other words, the second metal oxide material 32 may be formed at a sufficient thickness to provide an effective amount of material to dope the first metal oxide material 29 to tailor the properties (e.g., dielectric constant (k) and leakage current) of the overall insulative element 10 or semiconductor device structure 30. The second metal oxide material 32 may have a thickness that is the same or different than the thickness of the first metal oxide material 29. In some embodiments, the thickness of the second metal oxide material 32 may be less than the thickness of the first metal oxide material 29. By way of example and not limitation, the second metal oxide material 32 may have a thickness, as formed, in the range of from about 5 Å to about 30 Å.

In one embodiment, the first metal oxide material 29 is $Zr_yO_x$ and the second metal oxide material 32 is a mixture of $Zr_yO_x$ and $Nb_yO_x$. In one embodiment, the first metal oxide material 29 is $Zr_yO_x$ and the second metal oxide material 32 is a mixture of $Sr_yO_x$ and $Nb_yO_x$. In one embodiment, the first metal oxide material 29 is $Zr_yO_x$ and the second dielectric material 22 is a mixture of $Sr_yO_x$, $Nb_yO_x$, and $Ti_yO_x$. In one embodiment, the first metal oxide material 29 is $Zr_yO_x$, the second dielectric material 32 is a mixture of $Ti_yO_x$ and $SiO_x$, and the additional dielectric material 26 is $Al_yO_x$.

Figure 5C:
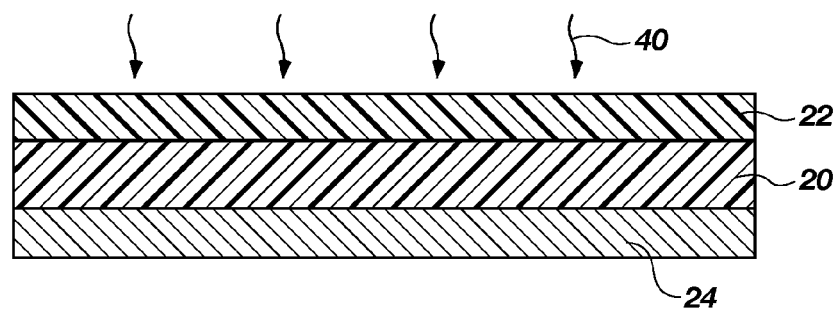

In some embodiments, the first and second metal oxide materials 29, 32 may be heated, as shown by arrows 40 in FIG. 5C. Heating (i.e., annealing) may cause at least some crystallization of the first metal oxide material 29, producing first dielectric material 20. The annealing may also cause or induce the migration or diffusion of at least some of the metal oxides of the second metal oxide material 32 into the first metal oxide material 29. In other words, the first metal oxide material 29 may become at least partially doped with molecules of the second metal oxide material 32 through the annealing. The first and second metal oxide materials 29, 32 are denoted in FIGS. 5C and 5D as first and second dielectric materials 20, 22 to indicate that the materials have been annealed. The interface between the first and second dielectric materials 20, 22 may not be as distinct or clear as is illustrated in FIG. 5C. For example, in some embodiments, the interface may more accurately be represented by a gradient of varying concentration of metal oxides of the second dielectric material 22 in the first dielectric material 20. In some embodiments, substantially all of the second dielectric material 22 may be incorporated into the first dielectric material 20 by way of diffusion.

In some embodiments, annealing may also cause at least some crystallization of the second metal oxide material 32. The temperature used to anneal and crystallize a dielectric material may depend on the composition of the dielectric material. The amount of time to which the first and second metal oxide materials 29, 32 are exposed to heat may depend on the anneal temperature. At a relatively high anneal temperature, the amount of time to induce crystallization may be less than the amount of time to induce crystallization at a relatively lower temperature. The anneal temperature and anneal time may be chosen to tailor the level of crystallization of at least portions of at least one of the first and second dielectric materials 20, 22. The anneal temperature and anneal time may also be selected to tailor the amount of dopant diffusion between the first and second dielectric materials 20, 22. By way of example and not limitation, the anneal temperature may be in the range of from about 300° C. to about 700° C., such as from about 500° C. to about 700° C., and the anneal time may be in the range of from about 1 minute to about 60 minutes, such as from about 3 minutes to about 5 minutes. The anneal may be conducted by increasing the temperature in a gradient or stepwise manner, or by raising the temperature to the desired temperature.

Annealing may take place in any atmosphere, depending on the desired properties of the first and second dielectric materials 20, 22 for their intended use. For example, annealing may take place in an inert (e.g., non-reactive) atmosphere, such as $N_2$, Ar, or He, in an oxidizing atmosphere, or in a reducing atmosphere.

Optionally, the first metal oxide material 29 may be annealed and at least partially crystallized before the second metal oxide material 32 is formed thereon (not shown). After the second metal oxide material 32 is formed, the first and second metal oxide materials 29, 32 may be annealed again. This process may result in an insulative element 10 including first and second dielectric materials 20, 22 having an effective dielectric constant that is lower than an effective dielectric constant resulting from a process in which the anneal and crystallization of the first metal oxide material 29 is not conducted before the formation of the second metal oxide material 32. Without being bound to a particular theory, it is believed that molecules from the second metal oxide material 32 diffuse more readily into an at least partially amorphous first metal oxide material 29 than into an at least partially crystallized first metal oxide material 29. The amount of diffusion between the first and second metal oxide materials 29, 32 may affect the overall dielectric constant of an insulative element 10 that includes the first and second dielectric materials 20, 22.

In some embodiments, the crystallization of at least portions of one or more of the first metal oxide material 29 and the second metal oxide material 32 may be induced through process acts involving heat that occur after forming the first and second metal oxide materials 29, 32, and not by a separate anneal act as described with reference to FIG. 5C. Additionally, the dispersion of molecules (also referred to as "doping") from the second metal oxide material 32 into the first metal oxide material 29 may be accomplished through process acts involving heat that occur after forming the first and second metal oxide materials 29, 32, and not by a separate anneal act as described with reference to FIG. 5C. For example, the first and second metal oxide materials 29, 32 may at least partially include one or more amorphous regions at formation. After formation of the first and second metal oxide materials 29, 32 over the substrate 24, one or more further processing acts, such as a backend process, may occur that subject the first and second metal oxide materials 29, 32 to heat for a desired period of time. By way of example, later deposition, diffusion, or anneal acts involved in forming or modifying one or more other structures (such as, for example, an electrode, a capping layer, contacts, or insulating layers) of the semiconductor device structure 30 may produce sufficient heat to crystallize one or more portions of the first and second dielectric metal oxide materials 29, 32, thus promoting dispersion of molecules from the second metal oxide material 32 into the first dielectric metal oxide material 29 (i.e., doping). In such embodiments, a separate anneal act (as described with reference to FIG. 5C) may not be utilized to achieve the crystallization and doping that may be desired in a specific application.

Figure 5D:
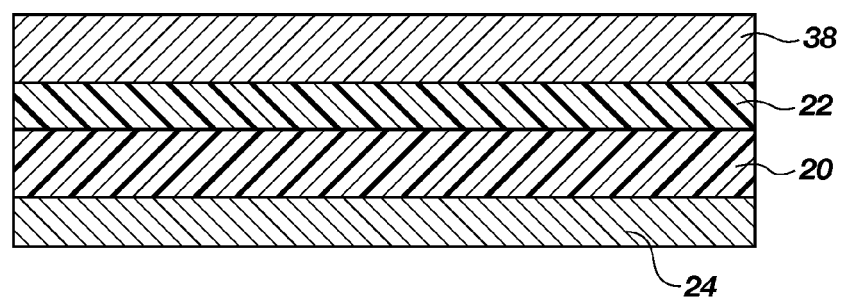

Referring now to FIG. 5D, optionally, one or more additional materials 38 may be formed over the second dielectric material 22. For example, in embodiments where the first and second dielectric materials 20, 22 are used as a capacitor dielectric (e.g., as the dielectric material 14 shown in FIG. 4), the substrate 24 may be or include a first electrode and the one or more additional materials 38 may be or include a second electrode. The second electrode may be formed by conventional semiconductor fabrication techniques, which are not described in detail herein.

By way of another example, in embodiments where the first and second dielectric materials 20, 22 are used as a gate dielectric in a volatile transistor (not shown), the substrate 24 may be a semiconductor substrate and the one or more additional materials 38 may be an electrically conductive gate structure. The conductive gate structure may be formed by conventional semiconductor fabrication techniques, which are not described in detail herein. By way of yet another example, in embodiments where the first and second dielectric materials 20, 22 are used as a dielectric structure in a non-volatile transistor (not shown), the substrate 24 may be a conductive charge retaining material and the one or more additional materials 38 may be a conductive control gate material. The conductive control gate material may be formed by conventional semiconductor fabrication techniques, which are not described in detail herein.

Another embodiment of a method of forming an insulative element 10 (as shown in FIG. 2, for example) or a capacitor is shown in FIGS. 6A through 6E.

Figure 6A:
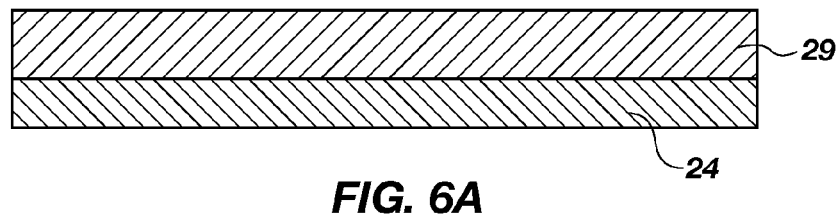
FIGS. 6A through 6E illustrate an embodiment of a process for forming an insulative element according to the present disclosure, such as the insulative element of FIG. 2.
Figure 6B:
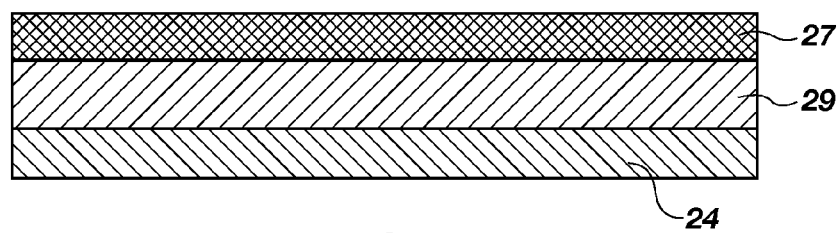

A first metal oxide material 29 may be formed on a substrate 24, as shown in FIG. 6A and as described above in relation to FIG. 5A. An additional oxide material 27 may be formed over the first metal oxide material 29, as shown in FIG. 6B. In some embodiments, the additional oxide material 27 may be a thin layer (relative to the thickness of the first metal oxide material 29) of material having a different dielectric constant than the first metal oxide material 29. For example, the additional oxide material 27 may be formed to have a thickness in the range of about one monolayer to about 5 Å at formation.

The additional oxide material 27 may function as a diffusion barrier to reduce, control, or eliminate diffusion or migration of dopants across the thickness of the additional oxide material 27 in a subsequent process involving heating of the insulative element 10. The additional oxide material 27 may be formed to include, by way of example, one or more of $HfO_2$, $SiO_2$, $Al_2O_3$, $GeO_2$, an oxynitride, and a rare earth oxide. For example, the additional oxide material 27 may be or include a metal oxide material.

Figure 6C:
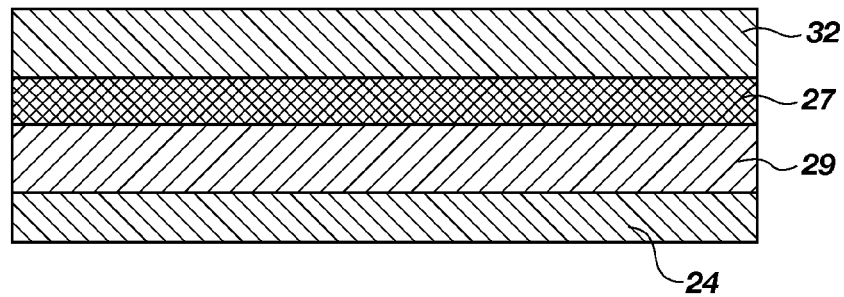

A second metal oxide material 32 may be formed over the additional oxide material 27, as shown in FIG. 6C and as explained above with reference to FIG. 5B. The second metal oxide material 32 may be selected to have a different dielectric constant than the first metal oxide 29 and the additional oxide material 27. For example, the second metal oxide material 32 may have a higher dielectric constant than the first metal oxide material 29.

Figure 6D:
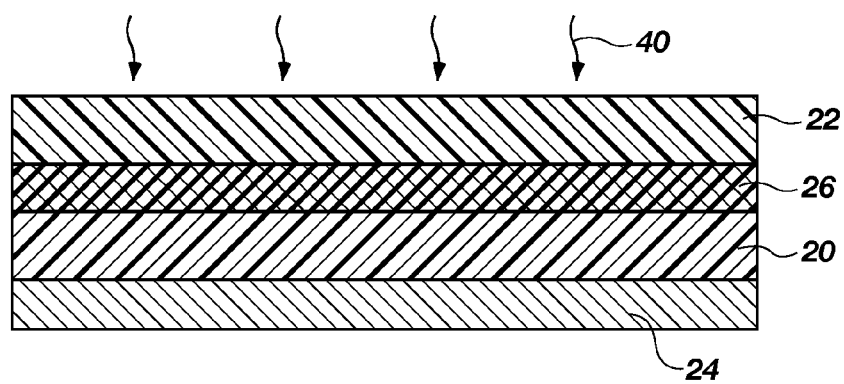

The first metal oxide material 29, second metal oxide material 32, and additional oxide material 27 may be annealed to induce one or more of crystallization and diffusion, as shown by arrows 40 in FIG. 6D. Without being bound to a particular theory, the presence of the additional oxide material 27 between the first and second metal oxide materials 29, 32 may substantially reduce, control, or eliminate diffusion (e.g., doping) of the first metal oxide material 29 with molecules of the second metal oxide material 32 during the annealing process. However, the anneal may cause molecules from the additional oxide material 27 to diffuse into at least one of the first metal oxide material 29 and the second metal oxide material 32. One or more of the first metal oxide material 29, second metal oxide material 32, and additional oxide material 27 may be at least partially crystallized by the annealing. For example, substantially all of the first metal oxide material 29 may be crystallized by the annealing.

Optionally, the annealing may not occur at this point in the process. Instead, the annealing may occur during a subsequent process act, such as by heating from a backend process. By way of example and not limitation, any other subsequent deposition, diffusion, or anneal acts in conjunction with forming the semiconductor device structure 30 incorporating an insulative element 10 formed by this method may provide sufficient heat to crystallize at least a portion of the first metal oxide material 29. The heat from the backend process may also induce diffusion of dopants between the additional oxide material 27 and at least one of the first metal oxide material 29 and the second metal oxide material 32.

The annealing or heating from a backend process may induce crystallization and doping of one or more of the first metal oxide material 29, second metal oxide material 32, and additional oxide material 27, resulting in an insulative element including a first dielectric material 20, a second dielectric material 22, and an additional dielectric material 26, as illustrated in FIG. 6D.

Figure 6E:
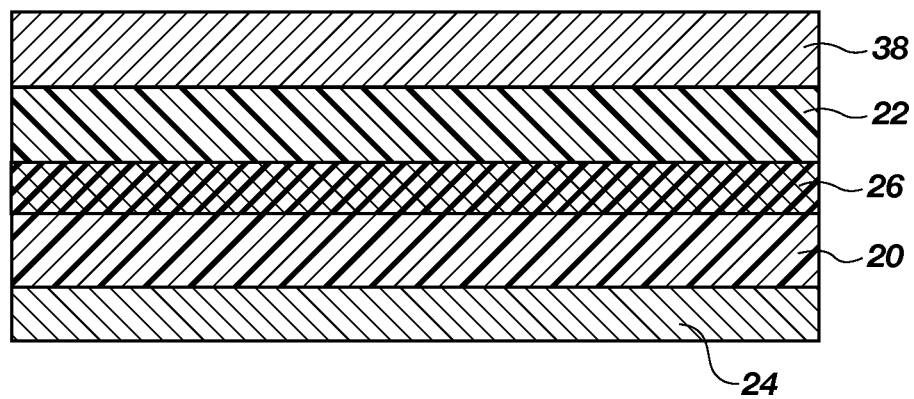

Optionally, one or more additional materials 38 may be formed over the second dielectric material 22, as shown in FIG. 6E and as explained above with reference to FIG. 5C. For example, the dielectric material formed by this method may function as a capacitor dielectric, and the substrate 24 may be or include a first electrode and the one or more additional materials 38 may be or include a second electrode. The second electrode may be formed by conventional semiconductor fabrication techniques, which are not described in detail herein.

The method described with reference to FIGS. 6A through 6E may, in some embodiments of the invention, be altered by forming the additional dielectric material 26 at a different location. For example, the additional dielectric material 26 may be formed before the first metal oxide material 29 (i.e., the additional dielectric material 26 may be located between the substrate 24 and the first dielectric material 20) (not shown). By way of another example, the additional dielectric material 26 may be formed after the second metal oxide material 32 (i.e., the additional dielectric material 26 may be located between the second dielectric material 22 and the one or more additional materials 38) (not shown). In some embodiments, more than one additional dielectric material 26 may be formed, and multiple locations in the dielectric structure may have an additional dielectric material 26. Each variation in location of the one or more additional dielectric materials 26 may change the properties (e.g., capacitance, dielectric constant, leakage current) of the insulative element 10 formed by the methods described. In this manner, the properties of the dielectric structure may be tailored to the specific application contemplated.

Another embodiment of a method of forming an insulative element 10 (as shown in FIG. 3, for example) or a capacitor is shown in FIGS. 7A through 7F.

Figure 7A:
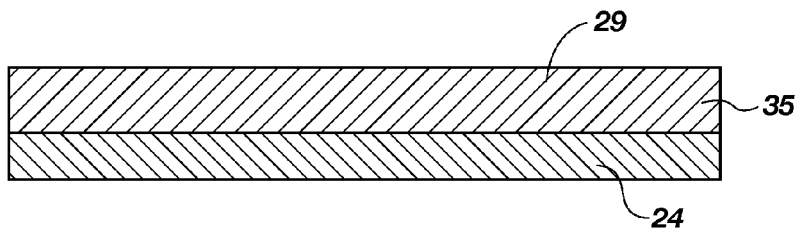
FIGS. 7A through 7F illustrate an embodiment of a process for forming an insulative element according to the present disclosure, such as the insulative element of FIG. 3.
Figure 7B:
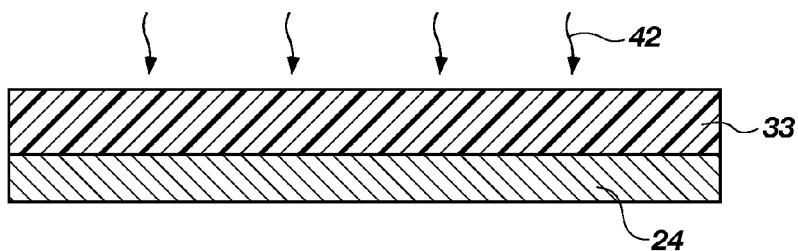

A first region 35 of a first metal oxide material 29 may be formed on a substrate 24, as shown in FIG. 7A and as described above in relation to FIG. 5A. The first region 35 may be at least substantially amorphous at formation. Next, the first region 35 may be annealed to induce at least some crystallization of the first region 35 of the first metal oxide material 29, as shown by the arrows 42 representing a first anneal in FIG. 7B. This first anneal may result in an at least partially crystallized first region 33 of a first dielectric material 20 (see FIG. 3). In some embodiments, at least substantially all of the first region 33 may be crystallized through the first anneal.

Figure 7C:
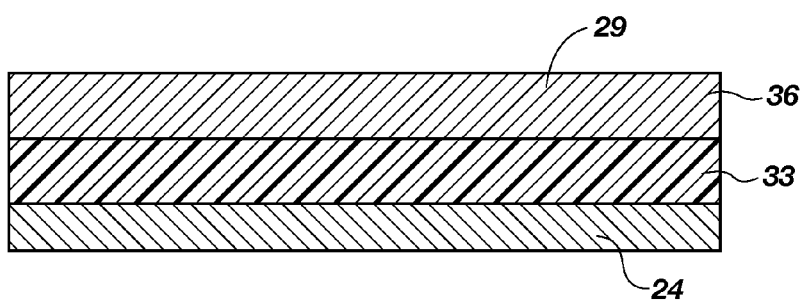

After the first region 33 is annealed and at least partially crystallized, a second region 36 of the first metal oxide material 29 may be formed over the first region 33, as shown in FIG. 7C. The second region 36 may be at least substantially amorphous at formation. The relative thicknesses of the first region 35 and the second region 36 may be adjusted to tailor the dielectric constant (k) of the insulative element 10.

Figure 7D:
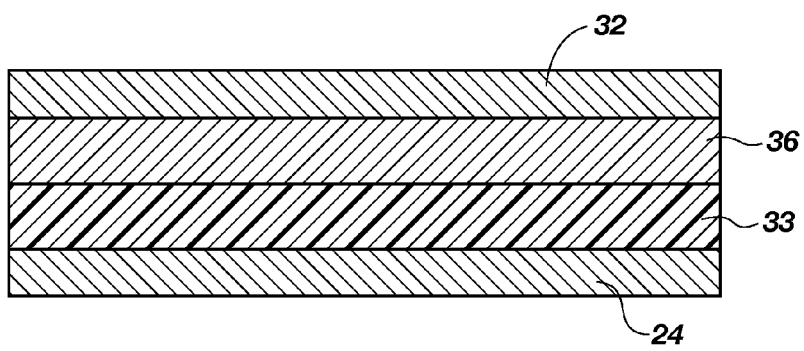

A second metal oxide material 32 may be formed over the second region 36, as shown in FIG. 7D and as explained above with reference to FIG. 5B. The second metal oxide material 32 may be selected to have a different dielectric constant than the first and second regions 35, 36 of the first metal oxide material 29. For example, the second metal oxide material 32 may be selected to have a higher dielectric constant than the first metal oxide material 29.

Figure 7E:
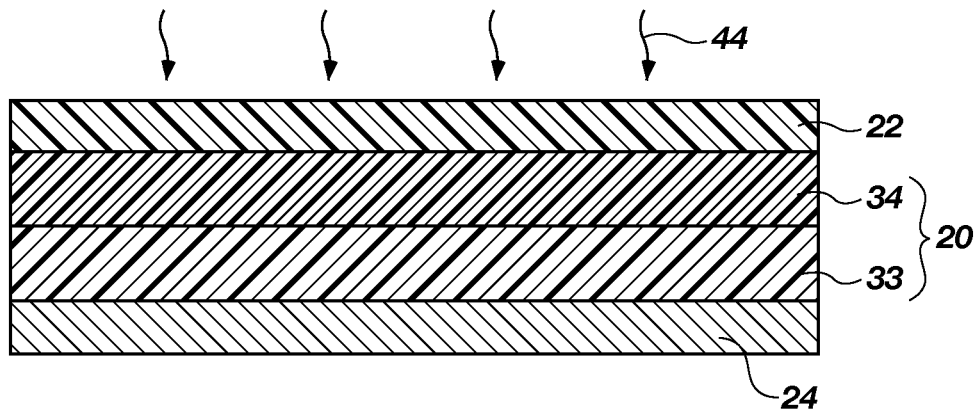

The first region 33, the second region 36, and the second metal oxide material 32 may be annealed, as shown by arrows 44 representing a second anneal, to induce one or more of crystallization and diffusion, as shown in FIG. 7E. Without being bound to a particular theory, the initial crystallization or pre-crystallization of the first region 35 of the first metal oxide material 29 (forming an at least partially crystallized first region 33) may reduce, control, or eliminate doping of the first region 33 with molecules from the second metal oxide material 32 during the annealing process, while the amorphous state of the second region 36 of the first metal oxide material 29 may enable at least some doping of the second region 36 with molecules of the second metal oxide material 32 during the annealing process. By way of example and not limitation, this method may result in a first region 33 of a first dielectric material 20 being at least substantially free of dopants from the second metal oxide material 32 and a second region 34 of a first dielectric material 20 including dopants from the second metal oxide material 32 dispersed therein (see FIGS. 7E and 7F).

Figure 7F:
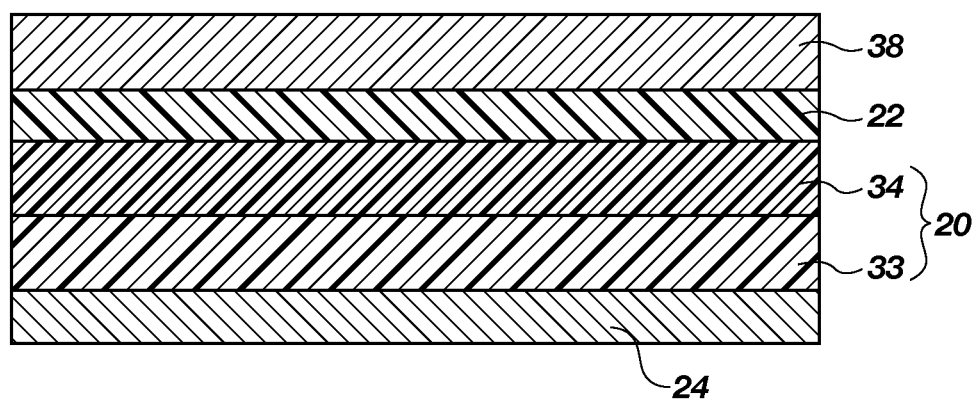

Optionally, one or more additional materials 38 may be formed over the second dielectric material 22, as shown in FIG. 7F and as explained above with reference to FIG. 5C. In embodiments where this method is used to form a capacitor, the substrate 24 may be or include a first electrode and the one or more additional materials 38 may be or include a second electrode. The second electrode may be formed by conventional semiconductor fabrication techniques, which are not described in detail herein.

The method described with reference to FIGS. 7A through 7F may, in some embodiments of the invention, be altered by omitting the second anneal represented by arrows 44 in FIG. 7E and replacing it with heat produced by a backend process. For example, any other subsequent deposition, diffusion, or anneal in conjunction with forming an integrated circuit incorporating an insulative element 10 formed by this method may provide sufficient heat to crystallize at least a portion of the second region 36 and to induce diffusion of at least some dopants from the second metal oxide material 32 into the second region 36, forming an at least partially crystallized and doped second region 34 of the first dielectric material 20. In this manner, the heat sufficient to crystallize at least a portion of the second region 34 and to induce diffusion of at least some dopants from the second metal oxide material 32 into the second region 34 may be provided by a backend process rather than by a separate anneal act (as shown in FIG. 7E).

CONCLUSION

In one embodiment, a method of forming an insulative element is described including forming a first metal oxide material on a substrate, forming a second metal oxide material over at least a portion of the first metal oxide material, and heating at least one of the first metal oxide material and the second metal oxide material to crystallize at least a portion thereof.

In a further embodiment, a method of forming an insulative element is described, including forming a substantially crystalline dielectric material on a substrate, forming a metal oxide material having a greater dielectric constant than the substantially crystalline dielectric material over the substantially crystalline dielectric material, and heating the substantially crystalline dielectric material and the metal oxide material to induce diffusion of dopants from the metal oxide material into the substantially crystalline dielectric material.

In an additional embodiment, a method of forming a capacitor is described, including forming a first electrode, forming a dielectric material over and in contact with the first electrode including forming a first oxide and a second oxide, heating at least one of the first and second oxides, and forming a second electrode over the dielectric material. The heating of the at least one of the first and second oxides at least partially crystallizes at least one of the first and second oxides.

In another embodiment, an insulative element is described, including a substantially crystalline first dielectric material having a first dielectric constant on a substrate and a second dielectric material having a second dielectric constant different than the first dielectric constant positioned over the first dielectric material. The first dielectric material may include dopants of the second dielectric material dispersed therein. The dielectric structure may also include an additional dielectric material.

In an additional embodiment, an insulative element is described, including a substrate and a first dielectric material in contact with at least a portion of the substrate. The first dielectric material may include an at least substantially crystalline metal oxide matrix and a metal oxide dopant dispersed within at least a portion thereof. The metal oxide matrix may include a first region including the metal oxide dopant dispersed therein and a second region being substantially free of the metal oxide dopant.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, combinations, equivalents, and alternatives falling within the scope of the invention as defined by the following appended claims and their legal equivalents.

What is claimed is:

1. An insulative element, comprising:
a substantially crystalline first dielectric material on a substrate;
a second dielectric material having a dielectric constant different than a dielectric constant of the substantially crystalline first dielectric material and positioned over the substantially crystalline first dielectric material, wherein dopants of the second dielectric material are dispersed in at least a portion of the substantially crystalline first dielectric material; and
an additional dielectric material having a material composition different than and in contact with at least one of the substantially crystalline first dielectric material and the second dielectric material.

2. The insulative element of claim 1, wherein the second dielectric material comprises a material having a dielectric constant greater than the dielectric constant of the substantially crystalline first dielectric material.

3. The insulative element of claim 1, wherein each of the substantially crystalline first dielectric material and the second dielectric material comprises at least one of hafnium oxide, zirconium oxide, silicon oxide, aluminum oxide, strontium oxide, titanium oxide, niobium oxide, tantalum oxide, germanium oxide, an oxynitride, and a rare earth oxide.

4. The insulative element of claim 1, wherein the substantially crystalline first dielectric material comprises at least one oxide material selected from the group consisting of hafnium oxide, zirconium oxide, aluminum oxide, and silicon oxide and the second dielectric material comprises at least one metal oxide material selected from the group consisting of strontium oxide, titanium oxide, niobium oxide, tantalum oxide, and a rare earth oxide.

5. The insulative element of claim 1, wherein:
the substantially crystalline first dielectric material comprises at least one of hafnium oxide, zirconium oxide, silicon oxide, and aluminum oxide;
the second dielectric material comprises at least one of strontium oxide, titanium oxide, niobium oxide, tantalum oxide, and a rare earth oxide; and
the additional dielectric material comprises at least one of aluminum oxide, hafnium oxide, germanium oxide, silicon oxide, and a rare earth oxide.

6. The insulative element of claim 1, wherein at least a portion of the additional dielectric material is located between and in contact with at least a portion of the substantially crystalline first dielectric material and at least a portion of the second dielectric material.

7. An insulative element comprising:
a substrate; and
a dielectric material in contact with at least a portion of the substrate, comprising:
a substantially crystalline metal oxide matrix; and
a metal oxide dopant dispersed within at least a portion of the substantially crystalline metal oxide matrix and incorporated into a crystalline phase of the substantially crystalline metal oxide matrix, a composition of the metal oxide dopant differing from a composition of the metal oxide matrix.

8. The insulative element of claim 7, wherein the substantially crystalline metal oxide matrix has a first dielectric constant and the metal oxide dopant has a second dielectric constant greater than the first dielectric constant.

9. The insulative element of claim 7, wherein the substrate comprises an electrode.

10. The insulative element of claim 9, wherein the electrode of the substrate comprises a first electrode, and further comprising a second electrode positioned on the opposite side of the dielectric material from the first electrode.

11. The insulative element of claim 10, wherein the dielectric material comprises a first dielectric material, and further comprising a second dielectric material comprising a metal oxide having the same composition as the composition of the metal oxide dopant and positioned at least partially between the first dielectric material and the second electrode.

12. The insulative element of claim 11, further comprising a third dielectric material comprising a metal oxide having a different composition than the substantially crystalline metal oxide matrix and the metal oxide dopant, located between the first electrode and the second electrode and in contact with at least one of the first dielectric material and the second dielectric material.

13. The insulative element of claim 7, wherein:
a first region of the substantially crystalline metal oxide matrix comprises the metal oxide dopant dispersed therein; and
a second region of the substantially crystalline metal oxide matrix is substantially free of the metal oxide dopant.

14. The insulative element of claim 7, wherein the metal oxide dopant is located between grain boundaries of the crystalline phase of the substantially crystalline metal oxide matrix.

15. The insulative element of claim 1, wherein the substantially crystalline first dielectric material has a first material composition, the second dielectric material has a second material composition different than the first material composition, and the additional dielectric material has a third material composition different than the first material composition and the second material composition.

16. The insulative element of claim 1, wherein the substantially crystalline first dielectric material has a thickness between about 30 Å and about 80 Å.

17. The insulative element of claim 1, wherein the second dielectric material has a thickness between about 5 Å and about 30 Å.

18. The insulative element of claim 1, wherein the additional dielectric material has a thickness between about one monolayer and about 5 Å.

19. An insulative element, comprising:
a substantially crystalline first dielectric material having a first dielectric constant on a substrate, the substantially crystalline first dielectric material having a first thickness between about 30 Å and about 80 Å and comprising at least one oxide material selected from the group consisting of hafnium oxide, zirconium oxide, aluminum oxide, and silicon oxide;
a second dielectric material having a second dielectric constant different than the first dielectric constant and positioned over the substantially crystalline first dielectric material, the second dielectric material having a second thickness less than the first thickness and between about 5 Å and about 30 Å and comprising at least one metal oxide material selected from the group consisting of strontium oxide, titanium oxide, niobium oxide, tantalum oxide, and a rare earth oxide; and
an additional dielectric material having a material composition different than and in contact with at least one of the substantially crystalline first dielectric material and the second dielectric material, the additional dielectric material having a thickness between about one monolayer and about 5 Å.

20. The insulative element of claim 19, wherein the additional dielectric material comprises at least one of aluminum oxide, hafnium oxide, germanium oxide, silicon oxide, and a rare earth oxide.

* * * * *